United States Patent
Cheng et al.

(10) Patent No.: US 7,022,265 B2
(45) Date of Patent: Apr. 4, 2006

(54) POLYAMIDE RESIN COMPOSITIONS WITH ELECTROMAGNETIC INTERFERENCE SHIELDING PROPERTIES AND ARTICLES FORMED THEREFROM

(75) Inventors: Paul P. Cheng, Washington, WV (US); Yuji Saga, Tochigi (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 317 days.

(21) Appl. No.: 10/323,259

(22) Filed: Dec. 19, 2002

(65) Prior Publication Data

US 2003/0199607 A1 Oct. 23, 2003

Related U.S. Application Data

(60) Provisional application No. 60/341,939, filed on Dec. 19, 2001.

(51) Int. Cl.
*H01B 1/24* (2006.01)
*C08K 7/04* (2006.01)
*C08K 7/02* (2006.01)

(52) U.S. Cl. .................. 252/506; 252/511; 523/137; 524/432; 524/538

(58) Field of Classification Search ............... 252/506, 252/511; 523/137; 524/432, 495, 496, 538
See application file for complete search history.

(56) References Cited

U.S. PATENT DOCUMENTS

| | | | | |
|---|---|---|---|---|
| 4,849,474 A | * | 7/1989 | Gallucci | 525/92 B |
| 4,921,889 A | * | 5/1990 | Lausberg et al. | 523/400 |
| 5,004,561 A | | 4/1991 | Nomura et al. | |
| 5,102,935 A | * | 4/1992 | Heinz et al. | 524/219 |
| 5,128,401 A | * | 7/1992 | Heinz et al. | 524/342 |
| 5,141,982 A | * | 8/1992 | Oku et al. | 524/432 |
| 5,310,598 A | * | 5/1994 | Yoshinaka et al. | 428/328 |
| 5,389,712 A | * | 2/1995 | El Sayed et al. | 524/424 |
| 5,399,295 A | * | 3/1995 | Gamble et al. | 252/511 |
| 5,750,616 A | * | 5/1998 | Shimpuku et al. | 524/496 |
| 5,872,187 A | * | 2/1999 | Takatani et al. | 525/133 |
| 5,895,607 A | | 4/1999 | Sugino et al. | |
| 6,384,128 B1 | * | 5/2002 | Wadahara et al. | 524/496 |

FOREIGN PATENT DOCUMENTS

JP 09087417 A * 3/1997

OTHER PUBLICATIONS

JPO machine translation of JP 09-87417A.*

* cited by examiner

*Primary Examiner*—Matthew A. Thexton

(57) ABSTRACT

Polyamide resin compositions suitable for molded articles comprising polyamide, thermoplastic polyphenol, and of carbon fiber are disclosed. These may optionally include aramid fiber and zinc oxide whisker. Such compositions show remarkable shielding performance when subjected to electromagnetic fields, and with outstanding control of warpage and toughness.

13 Claims, No Drawings

POLYAMIDE RESIN COMPOSITIONS WITH ELECTROMAGNETIC INTERFERENCE SHIELDING PROPERTIES AND ARTICLES FORMED THEREFROM

CROSS REFERENCE TO RELATED APPLICATION

This application claims the benefit of U.S. Provisional Application No. 60/341,939, filed Dec. 19, 2001

FIELD OF THE INVENTION

The present invention relates to polyamide resin compositions that can be molded into objects that possess excellent electromagnetic interference (EMI) shielding characteristics as well as high flowability, low levels of warpage, and low moisture absorption, which provides good dimensional stability.

BACKGROUND OF THE INVENTION

The rapidly growing market for electronics has led to a great demand for electrically conductive polymers. Electronic devices generate radio frequency radiation during operation, and to prevent consequent electromagnetic interference (EMI) with other devices, it is necessary to shield the source with an electrically conductive material. Polyamide resins are characterized by excellent mechanical properties, moldability, and chemical resistance and have, therefore, been used in automotive parts, mechanical components, and many other applications. Polyamides have also been used in electrical and electronic applications but, used alone, they are not electrically conductive and do not provide the EMI shielding and low warpage properties that are required for applications such as computer housings.

Polyamide resin compositions suitable for use in applications where EMI shielding is required are known. For example, the use of mixtures of thermoplastic resins, conductive fibers, and 20 weight percent of thermosetting resins such as a phenolic resin is disclosed in Japanese laid open patent 09-87417 (1997), and a blend of mixtures of two different thermoplastic resins and conductive fibers is disclosed in Japanese laid open patent 11-255907 (1999). No mention is made of any improved moisture absorption, warpage, and dimensional stability properties possessed by these resins.

There is still a need for a polyamide resin compositions that can be molded into objects that possess excellent EMI shielding characteristics as well as low levels of warpage and good dimensional stability. It is therefore an object of the present in invention to provide a composition that possesses these qualities. A feature of the present invention is that compositions disclosed herein are capable of being formed into articles that possess excellent EMI shielding characteristics as well as low levels of warpage and moisture absorption, which leads to good dimensional stability. An advantage of the present invention is that these compositions may be used to manufacture articles for applications where both EMI shielding performance and low levels of warpage and dimensional stability are required. These and other objects, features and advantages of the invention will become better understood upon having reference to the description of the invention herein.

SUMMARY OF THE INVENTION

There is disclosed and claimed herein an electromagnetic interference resistant polyamide resin composition comprising:
(a) 100 parts by weight of a polyamide;
(b) about 5 to about 50 parts by weight of a thermoplastic polyphenol, where the total amount of (a)+(b) is about 35 to about 90 weight percent based on the total weight of the composition; and
(c) carbon fibers that are present in about 5 to about 60 weight percent based on the total weight of the composition.

Optionally, the polyamide resin compositions claimed herein may contain up to 10 weight percent Kevlar® aramid fiber (available from E. I. DuPont de Nemours and Company). Further, the compositions claimed herein may contain up to 10 weight percent zinc oxide (ZnO) whiskers.

DETAILED DESCRIPTION

The polyamide used in the present invention is a thermoplastic polyamide, examples of which include, but are not limited to polyamides 6, 66, 46, 610, 69, 612, 11, 12, copolyamides, terpolyamides, and/or blends of two or more polyamides. The polyamide may be obtained from the polycondensation of one or more of adipic acid, sebacic acid, azelaic acid, dodecanedioic acid, other aliphatic or alicyclic dicarboxylic acids, and/or aromatic dicarboxylic acids with one or more diamines selected from a group consisting of aliphatic alkylenediamines, aromatic diamines, and alicyclic diamines as well as from the polycondensation of amino acids and lactams.

Illustrative examples include polyamide 66/6 copolymers, polyamide 66/68 copolymers, polyamide 66/610 copolymers, polyamide 66/612 copolymers, polyamide 66/10 copolymers, polyamide 66/12 copolymers, polyamide 6/68 copolymers, polyamide 6/610 copolymers, polyamide 6/612 copolymers, polyamide 6/10 copolymers, polyamide 6/12 copolymers, polyamide 6/66/610 terpolymers, polyamide 6/66/69 terpolymers, polyamide 6/66/11 terpolymers, polyamide 6/66/12 terpolymers, polyamide 6/610/11 terpolymers, polyamide 6/610/12 terpolymers, polyamide 6/66/PACM (bis-p-(aminocyclohexyl)methane) terpolymers. Of these, polyamide 66/6 copolymers, polyamide 6/66/610 terpolymers, polyamide 6/66/612 terpolymers, and mixtures of two or more of these polymers are preferred. Polyphthalamides, which are made from terephthalic acid and/or isophthalic acid and one or more aliphatic or alicyclic diamines and, optionally, one or more aliphatic or alicyclic diacids, and, optionally, one or more amino acids or lactams may also be used. Especially preferred are polyamide 66/6 copolymers in which the molar ratio of polyamide 66 units to polyamide 6 units ranges from 98:2 to 2:98; polyamide 6/66/610 terpolymers in which the ratio of the moles of polyamide 6 units and polyamide 66 units combined to the moles of polyamide 610 units is from 98:2 to 25:75, and the molar ratio of polyamide 6 units to polyamide 66 units is from 2:98 to 98:2; and polyamide 6/66/612 terpolymers in which the ratio of the moles of polyamide 6 units and polyamide 66 units combined to the moles of polyamide 612 units is from 98:2 to 25:75, and the molar ratio of polyamide 6 units to polyamide 66 units is from 2:98 to 98:2.

Polyamide 66 is especially advantageous for use in electric and electronic component applications due to its moldability and good mechanical and chemical resistance properties, and a particularly preferred embodiment of the present invention includes a mixture of polyamide 66 with at least one other polyamide, polyamide copolymer, or polyamide terpolymer. The polyamides are used in a ratio by weight of from 99:1 to 1:99 preferably from 95:5 to 50:50, and more preferably from 90:10 to 60:40. If the proportion of polyamide 66 is too large, the degree of warpage of molded parts is too great. Preferred blends are: blends of polyamide 6, polyamide 66, and a polyamide terpolymer; blends of polyamide 6 and polyamide 66; blends of polyamide 6 and a polyamide terpolymer; and blends of polyamide 66 and a polyamide terpolymer.

The presence of the thermoplastic polyphenol is believed to give the compositions of the present invention low levels of warpage, moisture absorption, and good dimensional stability. A variety of thermoplastic polyphenols are suitable for use in this invention. Preferred are thermoplastic phenol-formaldehyde resins, commonly known as novolacs or novolac resins, that are prepared by reacting at least one aldehyde with at least one phenol or substituted phenol in the presence of an acid or other catalyst such that there is a molar excess of the phenol or substituted phenol. Suitable phenols and substituted phenols include phenol, o-cresol, m-cresol, p-cresol, thymol, p-butyl phenol, tert-butyl catechol, resorcinol, bisphenol A, isoeugenol, o-methoxy phenol, 4,4'-dihydroxyphenyl-2,2-propane, isoamyl salicylate, benzyl salicylate, methyl salicylate, 2,6-di-tert-butyl-p-cresol, and the like. Suitable aldehydes and aldehyde precusors include formaldehyde, paraformaldehyde, polyoxymethylene, trioxane, and the like. More than one aldehyde and/or phenol may be used in the preparation of the novolac. A blend of two or more different novolacs may also be used. Any novolac that can be used for conventional plastic molding is suitable, although a number average molecular weight of between 500 and 1500 will provide minimal warpage and optimal mechanical properties.

The thermoplastic polyphenol used in the present invention may also be in the form of thermoplastic poly(hydroxystyrene) (which is also called polyvinylphenol). Copolymers with monomers such as styrene may also be used. Blends of copolymers and/or homopolymers may also be used. The thermoplastic poly(hydroxystyrene) polymers and copolymers may be linear or branched, but in the later case they must be melt-processable.

The ratio (based on weight) of polyamide to thermoplastic polyphenol should be in the range of between about 2:1 and about 20:1, and preferably between about 10:3 and about 10:1. Stated another way, for every 100 weight parts of polyamide, about 5 to about 50 weight parts, or preferably, about 10 to about 30 weight parts of thermoplastic polyphenol are used. If a ratio greater than about 20:1 is used, the resulting resin composition will not possess good flowability in the melt and warpage properties and will have insufficient dimensional stability in the presence of moisture. If a ratio of less than about 2:1 is used, the physical properties will be inadequate. Combined, the polyamide and the thermoplastic polyphenol should be present in the composition of this invention in about 35 to about 90 weight percent, or, preferably in about 50 to about 80 weight percent, or, more preferably in about 55 to about 70 weight percent, where the weight percentages are based on the total weight of the composition.

A wide variety of carbon fibers, both with respect to their dimensions and chemical composition, can be used in the polyamide resin compositions of this invention. Suitable examples include: carbon fibers made from polyacrylonitrile (PAN) fibers, carbon fibers made from pitch, and carbon fibers coated with a metal such as nickel or copper.

Suitable dimensions for the carbon fibers depend strongly on the type of application of the resin. However, in many applications, carbon fibers with an average aspect ratio (ratio of length to diameter) of between about 30 and about 70 and a diameter of between about 5 and about 15 microns are suitable.

The carbon fibers are present in the composition in an amount of about 10 to about 60 weight percent, or preferably, in about 20 to about 45 weight percent or, more preferably, in about 25 to about 40 weight percent, where the weight percentages are based on the total weight of the composition. When the composition consists of less than about 10 weight percent of carbon fibers, articles molded from it do not generally have an acceptable level of EMI shielding. When greater than about 60 weight percent is used, the material can become hard to process, making it inappropriate for technically demanding applications such as computer housings, where low warpage and moisture absorption is especially critical.

The EMI shielding properties of the compositions can be further optionally augmented by the addition of other electrically conductive fillers, such as carbon black, which is particularly effective when surface conductivity is important. If carbon black or other electrically conductive fillers are used, they will be present in from about 0.05 to about 15 weight percent, or preferably in about 2 to about 10 weight percent or more preferably in about 3 to about 8 weight percent, where the weight percentages are based on the total weight of the composition.

The composition of the present invention may also optionally contain up to about about 10 weight percent, based on the total weight of the composition of aramid fibers, such as Kevlar® fibers. The Kevlar® fibers will be preferably present in about 0.5 to about 10 weight percent, or more preferably, about 1 to about 8 weight percent, where the weight percentages are based on the total weight of the composition.

Other inorganic fillers and reinforcing agents that may also be optionally used in the present invention are inorganic fillers commonly used to reinforce engineering plastics. Examples include glass fibers, glass flakes, kaolin, clay, talc, wollastonite, calcium carbonate, silica, and potassium titanate. In particular, glass fibers are preferred. If inorganic fillers and/or reinforcing agents are used, they will be typically present in about 1 to about 30 weight percent, or preferably about 1 to about 25 weight percent, or more preferably about 2 to about 20 weight percent, where the weight percentages are based on the total weight of the composition. By blending an appropriate amount of the inorganic fillers and reinforcing agents, the original mechanical characteristics of the polyamide resin can be maintained.

The optional use of ZnO whiskers in amounts of up to about 10 weight percent, or preferably in about 1 to about 10 weight percent, or more preferably in about 3 to about 6 weight percent, where the weight percentages are based on the total weight of the composition, offers several advantages. The whiskers may add additional EMI shielding performance due to their own conductivity. They also randomize the carbon fiber orientation which may impart better EMI shielding properties in addition to improved warpage control. The ZnO whiskers also provide better surface conductivity. When these whiskers are combined with the compositions disclosed herein also containing Kevlar® fibers, they offer a synergistic effect in which the resulting compositions are both toughened and EMI shielded.

It is also possible to include other additives that serve to maintain or improve the properties of the resins used in the compositions of this invention. Examples include: heat stabilizers, plasticizers, antioxidants, nucleating agents, dyes, pigments, mold-release agents, flame retardants, and impact modifiers.

The compositions of the present invention are in the form of a blend, wherein all of the non-polymeric ingredients are homogeneously dispersed in and bound by the polymer matrix, such that the blend forms a unified whole. The blend may be obtained by combining the component materials using any melt-mixing method. The component materials may be mixed to homogeneity using a melt-mixer such as a single or twin-screw extruder, blender, kneader, Banbury mixer, etc. to give a resin composition. Or, part of the materials may be mixed in a melt-mixer, and the rest of the materials may then be added and further melt-mixed until homogeneous.

The compositions of the present invention may be molded into articles. Preferred are articles for uses where EMI shielding is required. Sensor housings for automotive electrical and electronic applications, electrical and electronic connectors, cellular telephone housings, and computer housings are examples of preferred uses.

The invention is illustrated by the following Examples.

EXAMPLES

The following methods were used to prepare the examples and measure the properties described in Tables 1–7:

The components were dry blended and then fed to a Toshiba 40 mm twin-screw extruder operating at 295° C. and 200 rpm. The resulting molten blend was extruded into strands that were then pelletized.

Plates (100 mm×100 mm×2 mm) were molded for measurements of EMI shielding and swelling upon moisture absorption, and disks (100 mm diameter×1.6 mm) were molded for warpage measurements.

EMI shielding determination: Electric field shielding effectiveness was measured by the ADVANTEST method described in Kogyozairyo (*Engineering Materials*) (1984) vol. 10, pp. 28–29.

Warpage determination: The coordinates of 8 points marked equally around the circumference of a disk (100 mm diameter and 1.6 mm thickness) placed on a flat stone table were measured with a Mitsutoyo FJ704 Coordinate Measuring Machine. A virtual flat disk plane was calculated from those eight coordinates, and the magnitude of warpage of the disk can be expressed by the distance between the highest real point and the lowest real point and the virtual flat plane. The measurements were taken either on disks that were dry as molded (DAM) or annealed at 130° C. for 3 hours. Examples 1–4 and Comparative Examples 1 and 2 were measured DAM and the results are given in Table 1. Example 5 and Comparative Example 5 were measured DAM and the results are given in Table 4. Examples 6 and 7 were measured both DAM and after annealing and the results are given in Table 6. Examples 8 and 9 were measured DAM and the results are given in Table 7.

For combustion testing, the procedures of UL Test No. UL-94 were followed using molded test pieces with a thickness of 0.8 mm.

Dimensional stability upon exposure to moisture was determined by conditioning samples in the form of molded plates (100 mm×100 mm×2 mm) at 80° C. and 95% relative humidity for 96 hours. The amount of swelling upon moisture absorption was determined by measuring, after conditioning, the percent increase in the dimensions of the plate in the transverse and flow directions, where the flow direction corresponds to the direction in which the molten polymer entered the mold used to prepare the test piece and the transverse direction is at right angles to the flow direction. The results for Examples 1–4 and Comparative Example 2 are given in Table 5. Lower percentages of swelling indicate better dimensional stability upon exposure to moisture.

Unnotched Izod impact strengths reported in Table 6 for Examples 6 and 7 were measured at 23° C. using ASTM method D256.

Unnotched Chary impact strengths reported in Table 7 for Examples 8 and 9 were measured at 23° C. using ISO method 179/1 eU.

Tensile elongations at break reported in Table 6 for Examples 6 and 7 were measured at 23° C. using ASTM method D638.

Tensile elongations at break reported in Table 7 for Examples 8 and 9 were measured at 23° C. using ISO method 527-1.

The following ingredients were used in the examples whose compositions are given in Tables 1, 3, 6, and 7.

| | |
|---|---|
| Polyamide 66: | Zytel ® FE1111, manufactured by E.I. DuPont de Nemours and Co, Inc. |
| Polyamide 6: | UBE1015B, manufactured by Ube. |
| Polyamide 6/66/610: | Elvamide ® 8061, manufactured by E.I. DuPont de Nemours and Co, Inc. |
| Carbon black: | AC38395-C1, 44 weight percent carbon black in polyamide 6/66/610 manufactured by Americhem. |
| Novolac resin: | A novolac resin prepared from phenol and formaldehyde with a number average molecular weight of about 1060. |
| Carbon fiber A: | Panex ® X48 manufactured by Zoltek. |
| Carbon fiber B: | Pyrofil ® TR06NE manufactured by Mitsubishi Rayon. |
| Carbon fiber C: | Panex ® X14 manufactured by Zoltek. |
| Glass fiber A: | FT756X manufactured by Asahi Fiber Glass. |
| Glass fiber B: | TP64 manufactured by Nippon Sheet Glass. |
| Flame retardant: | NVP PA6-2130 manufactured by Rinkagaku Kogyo, consisting of a masterbatch that contains 30 weight percent red phosphorous in nylon 6. |
| Stabilizer: | Heat stabilizer comprising a copper(I) halide and a potassium halide. |
| Kevlar ®: | Kevlar ® EE Merge M5151, a blend of p-aramid fiber and ethylene/vinyl acetate copolymer manufactured by E.I. DuPont de Nemours and Co, Inc. |
| ZnO whisker: | Pana-tetra ® WZ-0511 manufactured by Matasushita Amtec. |
| Na ionomer: | Himilan ® 1707 manufactured by Mitsui-DuPont Poly Chem. |

Table 1 contains the compositions of Examples 1–4 and Comparative Examples 1 and 2.

TABLE 1

| | Ex. 1 | Ex. 2 | Ex. 3 | Ex. 4 | Comp. Ex. 1 | Comp. Ex. 2 |
|---|---|---|---|---|---|---|
| Polyamide 66 | 0 | 34.7 | 34.7 | 49.7 | 0 | 43.7 |
| Polyamide 6 | 49.7 | 15 | 15 | 0 | 61.7 | 18 |
| Polyamide 6/66/610 | 0 | 5.6 | 0 | 0 | 0 | 0 |
| Carbon black | 10 | 0 | 10 | 10 | 10 | 10 |
| Novolac resin | 12 | 12 | 12 | 12 | 0 | 0 |
| Carbon fiber A | 20 | 24.4 | 20 | 20 | 20 | 20 |

TABLE 1-continued

|  | Ex. 1 | Ex. 2 | Ex. 3 | Ex. 4 | Comp. Ex. 1 | Comp. Ex. 2 |
|---|---|---|---|---|---|---|
| Glassfiber A | 8 | 8 | 8 | 8 | 8 | 8 |
| Stabilizer | 0.3 | 0.3 | 0.3 | 0.3 | 0.3 | 0.3 |

All ingredient quantities are given in weight percents based on the total weight of the composition.

Table 2 demonstrates the effectiveness of the addition of a novolac resin on warpage properties. The comparison of Example 1 with Comparative Example 1 and that of Example 3 with Comparative Example 2 shows that the presence of a novolac resin will substantially lower the degree of warpage of a polyamide resin composition containing carbon fibers. The comparison of Example 3 with Example 4 shows that blending polyamide 6 with polyamide 66 can further reduce warpage. The comparison of Example 2 with Example 3 shows that decreasing the carbon black content while increasing the carbon fiber content can reduce warpage without significant loss of EMI shielding effectiveness.

TABLE 2

|  | EMI shielding at 300 MHz (dB) | Warpage (DAM) (mm) |
|---|---|---|
| Ex. 1 | 44 | 0.486 |
| Ex. 2 | 42 | 0.350 |
| Ex. 3 | 43 | 1.0 |
| Ex. 4 | 44 | 2.594 |
| Comp. Ex. 1 | 43 | 3.479 |
| Comp. Ex. 2 | 42 | 4.592 |

Table 3 contains the compositions of Example 5 and Comparative Example 3.

TABLE 3

|  | Ex. 5 | Comp. Ex. 3 |
|---|---|---|
| Polyamide 66 | 33.7 | 44.7 |
| Polyamide 6/66/610 | 13 | 13 |
| Novolac resin | 11 | 0 |
| Carbon fiber B | 23 | 23 |
| Flame retardant | 19 | 19 |
| Stabilizer | 0.3 | 0.3 |

All ingredient quantities are given in weight percents based on the total weight of the composition.

Table 4 demonstrates the effectiveness of the addition of a novolac resin on warpage and flammability results for Example 5 and Comparative Example 3, each of which contains the same amount of flame retardant.

TABLE 4

|  | EMI shielding at 300 MHz (dB) | Warpage (DAM) (mm) | UL Combustion Test |
|---|---|---|---|
| Ex. 5 | 44 | 0.499 | V-0 |
| Comp. Ex. 3 | 42 | 1.832 | Fail |

Table 5 demonstrates the effect of the presence of a novolac resin upon the dimensional stability of the compositions of Examples 1–5 when compared to Comparative Example 2.

TABLE 5

|  | Percentage Swelling after Conditioning | |
|---|---|---|
|  | Transverse Direction | Flow Direction |
| Ex. 1 | 0.26 | 0.11 |
| Ex. 2 | 0.40 | 0.13 |
| Ex. 3 | 0.33 | 0.11 |
| Ex. 4 | 0.35 | 0.13 |
| Comp. Ex. 2 | 0.55 | 0.18 |

Tables 6 and 7 contain the compositions of Examples 6–9 and show the toughening effects of Kevlar® fibers on the compositions disclosed earlier herein, and the further improvement on warpage from the addition of zinc oxide whiskers.

TABLE 6

|  | Ex. 6 | Ex. 7 |
|---|---|---|
| Polyamide 66 | 27.5 | 28.9 |
| Polyamide 6 | 0 | 1.1 |
| Na ionomer | 2 | 2 |
| Novolac resin | 9 | 9.5 |
| Stabilizer | 0.5 | 0.5 |
| Flame retardant | 16 | 16 |
| Carbon fiber C | 20 | 20 |
| Glass fiber B | 12 | 12 |
| Kevlar ® | 3 | 0 |
| Carbon black | 10 | 10 |
| Unnotched Izod impact strength (J/m) | 603 | 558 |
| Tensile elongation at break (%) | 1.8 | 1.7 |
| EMI shielding at 300 MHz (dB) | 41 | 48 |
| EMI shielding at 1 GHz (dB) | 25 | 33 |
| Warpage (DAM) (mm) | 0.37 | 0.17 |
| Warpage (After annealing) (mm) | 0.58 | 1.39 |

All ingredient quantities are given in weight percents based on the total weight of the composition.

TABLE 7

|  | Ex. 8 | Ex. 9 |
|---|---|---|
| Polyamide 66 | 27.7 | 30.7 |
| Polyamide 6,66,610 | 12 | 13 |
| Novolac resin | 10 | 11 |
| Stabilizer | 0.3 | 0.3 |
| Flame retardant | 19 | 19 |
| Carbon fiber-2 | 23 | 23 |
| Kevlar ® | 3 | 3 |
| ZnO whisker | 5 | 0 |
| Unnotched Charpy impact strength (kJ/m$^2$) | 50 | 56 |
| Tensile elongation at break (%) | 1.4 | 1.7 |
| EMI shielding at 300 MHz (dB) | 47 | 46 |
| EMI shielding at 1 GHz (dB) | 36 | 31 |
| Warpage (DAM) (mm) | 0.26 | 0.55 |

All ingredient quantities are given in weight percents based on the total weight of the composition.

The invention claimed is:
1. An electromagnetic interference resistant polyamide resin composition comprising:

(a) 100 parts by weight of a polyamide;
(b) about 5 to about 50 parts by weight of a thermoplastic polyphenol, where the total amount of (a)+(b) is about 35 to about 90 weight percent based on the total weight of the composition;
(c) carbon fibers that are present in about 5 to about 60 weight percent based on the total weight of the composition; and
(d) zinc oxide whiskers that are present in about 1 to about 10 weight percent, based on the total weight of the composition.

2. The electromagnetic interference resistant polyamide resin composition of claim 1 further comprising inorganic fillers or reinforcing agents that are present in about 1 to about 30 weight percent based on the total weight of the composition.

3. The electromagnetic interference resistant polyamide resin composition of claim 1 further comprising carbon black in from about 0.05 to about 15 weight percent based on the total weight of the composition.

4. The electromagnetic interference resistant polyamide resin composition of claim 1 wherein said polyamide is a blend selected from the group consisting of: blends of polyamide 6, polyamide 66, and a polyamide terpolymer, blends of polyamide 6 and polyamide 66; blends of polyamide 6 and a polyamide terpolymer and blends of polyamide 66 and a polyamide terpolymer.

5. The electromagnetic interference resistant polyamide resin composition of claim 1 further comprising aramid fibers that are present in up to about 10 weight percent, based on the total weight of the composition.

6. An electromagnetic interference resistant polyamide resin composition comprising:
(a) 100 parts by weight of a polyamide;
(b) about 5 to about 50 parts by weight of a thermoplastic polyphenol, where the total amount of (a)+(b) is about 35 to about 90 weight percent based on the total weight of the composition;
(c) carbon fibers that are present in about 5 to about 60 weight percent based on the total weight of the composition; and
(d) aramid fibers that are present in about 0.5 about 10 weight percent, based on the total weight of the composition.

7. The electromagnetic interference resistant polyamide resin composition of claim 6 further including up to about 10 parts by weight of zinc oxide whiskers.

8. The electromagnetic interference resistant polyamide resin composition of claim 6 further comprising inorganic fillers or reinforcing agents that are present in from about 1 to about 30 weight percent based on the total weight of the composition.

9. The electromagnetic interference resistant polyamide resin composition of claim 6 further comprising carbon black that is present in from about 0.05 to about 15 weight percent based on the total weight of the composition.

10. The electromagnetic interference resistant polyamide resin composition of claim 6 wherein said polyamide is a blend selected from the group consisting of: blends of polyamide 6, polyamide 66, and a polyamide terpolymer; blends of polyamide 6 and polyamide 66; blends of polyamide 6 and a polyamide terpolymer; and blends of polyamide 66 and a polyamide terpolymer.

11. The electromagnetic interference resistant polyamide resin composition of claim 1 or 6 where the thermoplastic polyphenol is novolac.

12. The electromagnetic interference resistant polyamide resin composition of any one of claim 1 or 6 where the thermoplastic polyphenol is poly(hydroxystyrene).

13. An article molded from the compositions of claim 1 or 6.

* * * * *